United States Patent
Alshinnawi et al.

(10) Patent No.: US 9,507,393 B2
(45) Date of Patent: Nov. 29, 2016

(54) DYNAMIC SURFACE AREA EXPANSION IN A REAR DOOR HEAT EXCHANGER

(71) Applicant: Lenovo Enterprise Solutions (Singapore) Pte. Ltd., Singapore (SG)

(72) Inventors: Shareef F. Alshinnawi, Durham, NC (US); Gary D. Cudak, Creedmoor, NC (US); Edward S. Suffern, Chapel Hill, NC (US); J. Mark Weber, Wake Forest, NC (US)

(73) Assignee: Lenovo Enterprise Solutions Pte. Ltd. (SG)

(*) Notice: Subject to any disclaimer, the term of this patent is extended or adjusted under 35 U.S.C. 154(b) by 729 days.

(21) Appl. No.: 13/929,356

(22) Filed: Jun. 27, 2013

(65) Prior Publication Data
US 2014/0362520 A1 Dec. 11, 2014

Related U.S. Application Data (63) Continuation of application No. 13/911,159, filed on Jun. 6, 2013.

(51) Int. Cl.
*G06F 1/20* (2006.01)
*H05K 7/20* (2006.01)

(52) U.S. Cl.
CPC .......... *G06F 1/206* (2013.01); *H05K 7/20781* (2013.01)

(58) Field of Classification Search
None
See application file for complete search history.

(56) References Cited

U.S. PATENT DOCUMENTS

| | | | |
|---|---|---|---|
| 5,467,250 A | 11/1995 | Howard et al. | |
| 6,164,369 A | 12/2000 | Stoller | |
| 7,112,131 B2 | 9/2006 | Rasmussen et al. | |
| 7,170,745 B2 | 1/2007 | Bash et al. | |
| 7,255,640 B2 | 8/2007 | Aldag et al. | |
| 7,403,391 B2 | 7/2008 | Germagian et al. | |
| 7,646,603 B2 | 1/2010 | Bard et al. | |
| 7,746,634 B2 | 6/2010 | Hom et al. | |

(Continued)

FOREIGN PATENT DOCUMENTS

| | | | | |
|---|---|---|---|---|
| JP | 2004-170040 A | 6/2004 | | |
| WO | WO 2009020668 A1 * | 2/2009 | ......... | H05K 7/20736 |

OTHER PUBLICATIONS

Vette Corp, "Coolcentric®, Rear Door Heat Exchanger: Planning Guide", 2011, Vette Corp., Part#104780 Rev D.*

(Continued)

*Primary Examiner* — Mohammad Ali
*Assistant Examiner* — Kelvin Booker
(74) *Attorney, Agent, or Firm* — Katherine S. Brown; Jeffrey L. Streets

(57) ABSTRACT

A method comprising flowing a liquid through supply pipe couplings to a fin tube assembly of an air-to-liquid heat exchanger and through the fin tube assembly to return pipe couplings, wherein the fin tube assembly forms a central air flow pathway. The method further comprises passing air through components within a rack secured to the rear door heat exchanger and through the fin tube assembly and detecting an operating condition within the rack. The method then automatically moves the fin tube assembly from a retracted position to an extended position in response to the operating condition, wherein the retracted position directs substantially all of the air to exit the rack through the central air flow pathway, and wherein the extended position allows the air to exit through the central air flow pathway and also through first and second side air flow pathways.

6 Claims, 6 Drawing Sheets

(56) References Cited

U.S. PATENT DOCUMENTS

| | | | |
|---|---|---|---|
| 7,990,709 B2 | 8/2011 | Campbell et al. | |
| 8,144,464 B2 | 3/2012 | VanDerVeen et al. | |
| 8,436,246 B1* | 5/2013 | Scofield | H05K 7/20272 174/137 R |
| 9,297,571 B1* | 3/2016 | Correa | F25D 19/00 |
| 9,301,413 B2* | 3/2016 | Cox | H05K 5/0239 |
| 9,314,886 B2* | 4/2016 | Eckberg | B23P 15/26 |
| 2006/0232945 A1* | 10/2006 | Chu | H05K 7/2079 361/724 |
| 2008/0285228 A1* | 11/2008 | Koch | G06F 1/20 361/679.53 |
| 2009/0080173 A1* | 3/2009 | Porter | H05K 7/20827 361/831 |
| 2009/0100848 A1* | 4/2009 | Kuriyama | H05K 7/20745 62/132 |
| 2009/0120622 A1* | 5/2009 | Koch | H05K 7/20781 165/104.33 |
| 2009/0150123 A1* | 6/2009 | Archibald | G06F 17/5004 703/1 |
| 2009/0154096 A1* | 6/2009 | Iyengar | H05K 7/20754 361/694 |
| 2009/0188659 A1* | 7/2009 | Delia | G05D 23/1931 165/239 |
| 2009/0201640 A1* | 8/2009 | Bard | H05K 7/20181 361/694 |
| 2009/0205416 A1* | 8/2009 | Campbell | G01F 1/34 73/202.5 |
| 2009/0225514 A1* | 9/2009 | Correa | H05K 7/20781 361/701 |
| 2009/0229194 A1 | 9/2009 | Armillas | |
| 2009/0262501 A1* | 10/2009 | Claassen | G06F 1/20 361/701 |
| 2010/0147490 A1* | 6/2010 | Campbell | H05K 7/2079 165/80.3 |
| 2010/0193175 A1 | 8/2010 | Gilliland et al. | |
| 2011/0051372 A1* | 3/2011 | Barringer | H05K 7/20781 361/701 |
| 2011/0069452 A1* | 3/2011 | Campbell | H05K 7/20745 361/696 |
| 2011/0185758 A1* | 8/2011 | Shimokawa | H05K 7/202 62/259.2 |
| 2011/0205705 A1* | 8/2011 | Graybill | H05K 7/20836 361/696 |
| 2011/0232889 A1* | 9/2011 | Eckberg | F28D 1/0435 165/200 |
| 2011/0290448 A1* | 12/2011 | Campbell | F28D 1/0471 165/104.13 |
| 2012/0298335 A1* | 11/2012 | Eckberg | H05K 7/2079 165/104.19 |
| 2012/0300398 A1* | 11/2012 | Eckberg | H05K 7/2079 361/692 |
| 2013/0019627 A1* | 1/2013 | Yoshikawa | H05K 7/20818 62/259.2 |
| 2013/0021746 A1* | 1/2013 | Campbell | H05K 7/20145 361/679.47 |
| 2013/0098599 A1* | 4/2013 | Busch | H05K 7/20209 165/294 |
| 2013/0105139 A1* | 5/2013 | Campbell | H05K 7/20709 165/300 |
| 2013/0107447 A1* | 5/2013 | Campbell | H05K 7/20709 361/679.47 |
| 2013/0118712 A1* | 5/2013 | Iyengar | H05K 7/20736 165/104.14 |
| 2013/0133873 A1* | 5/2013 | Campbell | H05K 7/20281 165/281 |
| 2013/0166094 A1* | 6/2013 | Eckberg | H05K 7/20836 700/300 |
| 2013/0264026 A1* | 10/2013 | Eckberg | B23P 15/26 165/67 |
| 2013/0264027 A1* | 10/2013 | Eckberg | F28F 27/00 165/67 |
| 2013/0265719 A1* | 10/2013 | Eckberg | H05K 7/20781 361/701 |
| 2013/0306269 A1* | 11/2013 | Helbig | F28F 9/007 165/67 |
| 2013/0333414 A1* | 12/2013 | Inaba | H05K 7/20681 62/513 |
| 2014/0133099 A1* | 5/2014 | Campbell | H05K 7/20781 361/698 |
| 2014/0226280 A1* | 8/2014 | Alshinnawi | H05K 7/20145 361/679.49 |
| 2014/0352107 A1* | 12/2014 | Cox | E05D 7/12 16/50 |
| 2014/0355201 A1* | 12/2014 | Alshinnawi | H05K 7/20736 361/679.47 |

OTHER PUBLICATIONS

Vette Thermal Solutions, LLC., "Coolcentric®, Making Data Centers Sustainable", 2013, Pelham, NH, Vette Thermal Solutions, LLC.*

Vette Thermal Solutions, LLC., "The Coolcentric® Family of Rear Door Heat Exchangers, ", 2013, Pelham, NH, Vette Thermal Solutions, LLC.*

Vette Thermal Solutions, LLC., "The Coolcentric® Sidecar", 2013, Pelham, NH, Vette Thermal Solutions, LLC.*

Lawrence Berkeley National Laboratory/U.S. Dept. of Energy, "Data Center Rack Cooling with Rear-door Heat Exchanger, Technical Case—Study Bulletin", Jun. 2010.*

Lenovo®, "Rear Door Heat eXchanger V2", 2014, Lenovo®, document ID LYD03136-USEN-01.*

IBM, "Rear Door Heat eXchanger, Planning Guide", Jul. 2008, IBM.*

Grimshaw, J.; McSweeney, M.; Novotny, S. And Gagnon, M., "Data Center Rack Level Cooling Utilizing Water-Cooled, Passive Rear Door Heat Exchangers (RDHx) as a Cost Effective Alternative to Crah Air Cooling", Dec. 2011, Coolcentric®.*

* cited by examiner

DYNAMIC SURFACE AREA EXPANSION IN A REAR DOOR HEAT EXCHANGER

CROSS-REFERENCE TO RELATED APPLICATIONS

This application is a continuation of U.S. patent application Ser. No. 13/911,159 filed on Jun. 6, 2013, which application is incorporated by reference herein.

BACKGROUND

Field of the Invention

The present invention relates to a computer system rack having a rear door heat exchanger and methods of using a rear door heat exchanger.

Background of the Related Art

Computer systems use electrical energy and produce heat as a byproduct of electrical resistance. Rack-based computer systems include many rack-mounted components in a high-density arrangement, which can produce a considerable amount of heat. Excess heat must be removed from the rack to control internal temperatures and to maintain system reliability, performance, and longevity. In a conventional rack-based computer system, rack-mounted fans move cool air through the rack to remove the excess heat and cool the components. The heated exhaust air must then be transported to a computer-room air conditioner ("CRAC") that cools the air before returning the cooled air to the data center.

In a conventional datacenter layout, racks in a data center are commonly arranged in an organized hot-aisle/cold-aisle layout to minimize the likelihood that appreciable volumes of heated exhaust air will directly re-entering the racks. A hot-aisle/cold-aisle layout may include alternating hot aisles and cold aisles, with the front of each rack sharing a cold aisle with one adjacent rack and the rear of each rack sharing a hot aisle with another adjacent rack. The CRAC supplies the cooled air to the cold aisles. The air from the cool aisle is drawn into the front of each rack and the heated air is exhausted through the rear of the rack to the hot aisle. The heated exhaust air recirculates through the CRAC to be cooled and returned back to the cold aisles.

Additional cooling capacity may be added to a data center using a rear door heat exchanger. A rear door heat exchange is typically secured to the back side of a computer system rack and uses a liquid, such as water, as a cooling fluid that is passed through one or more fin tubes. Hot exhaust air from exiting the rack passes over and through the fins so that heat energy is transferred from the air to the liquid. In addition to providing more cooling capacity, the use of a rear door heat exchanger may facilitate data center configurations other than the conventional hot-aisle/cold-aisle configuration.

BRIEF SUMMARY

One embodiment of the present invention provides a method comprising flowing a liquid through a plurality of supply pipe couplings to a fin tube assembly of an air-to-liquid heat exchanger and through the fin tube assembly to a plurality of return pipe couplings, wherein the fin tube assembly forms a central air flow pathway. The method further comprises passing air through components within a rack secured to the rear door heat exchanger and through the fin tube assembly and detecting an operating condition within the rack. The method then automatically moves the fin tube assembly from a retracted position to an extended position in response to the operating condition exceeding an operating condition threshold, wherein the retracted position of the fin tube assembly directs substantially all of the air to exit the rack through the central air flow pathway, and wherein the extended position of the fin tube assembly allows the air to exit the rack through the central air flow pathway and also through first and second side air flow pathways. Moving the fin tube assembly from the retracted position to the extended position causes the plurality of supply pipe couplings to extend across the first side air flow pathway and the plurality of return pipe couplings to extend across the second side air flow pathway. The plurality of supply pipe couplings include one or more fin tube sections for cooling the air that exits the rack through the first side air flow pathway and the plurality of return pipe couplings include one or more fin tube sections for cooling the air that exits the rack through the second side air flow pathway.

DETAILED DESCRIPTION

One embodiment of the present invention provides a rear door heat exchanger comprising a door frame have opposing first and second edges, a fluid supply manifold secured along the first edge of the door frame, a fluid return manifold secured along the second edge of the door frame, a fin tube assembly including a plurality of fin tubes extending across a central region of the rear door heat exchanger and forming an air flow pathway through the fin tube assembly, and an actuator for controllably moving the fin tube assembly from a retracted position to an extended position. The rear door heat exchanger further comprises a plurality of supply pipe coupling assemblies and a plurality of return pipe coupling assemblies, each supply pipe coupling assembly providing fluid communication from the fluid supply manifold to one of the plurality of fin tubes and each return pipe coupling assembly provide fluid communication from one of the plurality of fin tubes to the fluid return manifold.

Each pipe coupling assembly preferably includes cooling fins. When the fin tube assembly is in the extended position, air can exit the rack through first and second side air flow pathways. Since the pipe coupling assemblies extend across the side air flow pathways, the cooling fins increase the cooling capacity of the rear door heat exchanger.

One embodiment of a pipe coupling assembly includes three pipe joints and two rigid pipe sections. Accordingly, the pipe coupling assembly will fold and unfold in a controlled and repeatable manner without constricting the flow of cooling fluid within the pipe coupling assembly or getting in the way of the fin tube assembly when it retracts. Optionally, each of the three pipe joints may be independently selected from a pivot coupling and a flexible tube. A non-limiting example of a pivot coupling includes a housing and spherical member with a port through the spherical member, wherein a first pipe is coupled to the housing and a second pipe is coupled to the port of the spherical member such that fluid communication is provided from the first pipe through the housing and the port to the second pipe.

A further embodiment of the rear door heat exchanger includes a first sealing plate extending from a first edge of the fin tube assembly to the first edge of the door frame and a second sealing plate extending from a second edge of the fin tube assembly to the second edge of the door frame. When the fin tube assembly is in the retracted position, the sealing plates are responsible for directing the flow of hot exhaust air from the rack components through the fin tube assembly. When the fin tube assembly is moved between the retracted and extended positions, the sealing plates are moved in the same manner. Accordingly, when the fin tube assembly is in the extended position, there is a gap between the sealing plates and the door frame where some of the hot exhaust air may also exit the rack.

The actuator is a mechanical device responsible for moving the fin tube assembly back-and-forth between the retracted and expanded positions. The actuator may take many forms, including, without limitation, a hydraulic cylinder or a motor and worm gear. Any number of actuators may be used. So that the fin tube assembly moves in a substantially translational rearward movement, the rear door heat exchanger will preferably include two actuators, and most preferably include four actuators located at each corner of the door frame.

Embodiments of the rear door heat exchanger may further include a hinge secured to one edge of the door frame for attachment to a rack. Such a hinge allows rear access to the components within the rack.

Further embodiments of the rear door heat exchanger may include a plurality of air-pressure sensors disposed across the fin tub assembly. Signals from the air pressure sensors may be provided to a rack management entity to determine when the air pressure is high enough to require extending the fin tube assembly so that an additional amount of air can be cooled. The additional cooling capacity provided in the extended position will reduce the air pressure on the rack side of the fin tube assembly. The lower air pressure will reduce the likelihood of hot exhaust air back flowing into any of the components in the rack. Components with low air flow fans are the most vulnerable to hot exhaust air backflow causing damaging component temperatures.

Another embodiment of the present invention provides a method comprising flowing a liquid through a plurality of supply pipe couplings to a fin tube assembly of an air-to-liquid heat exchanger and through the fin tube assembly to a plurality of return pipe couplings, wherein the fin tube assembly forms a central air flow pathway. The method further comprises passing air through components within a rack secured to the rear door heat exchanger and through the fin tube assembly and detecting an operating condition within the rack. The method then automatically moves the fin tube assembly from a retracted position to an extended position in response to the operating condition exceeding an operating condition threshold, wherein the retracted position of the fin tube assembly directs substantially all of the air to exit the rack through the central air flow pathway, and wherein the extended position of the fin tube assembly allows the air to exit the rack through the central air flow pathway and also through first and second side air flow pathways. Moving the fin tube assembly from the retracted position to the extended position causes the plurality of supply pipe couplings to extend across the first side air flow pathway and the plurality of return pipe couplings to extend across the second side air flow pathway. The plurality of supply pipe couplings include one or more fin tube sections for cooling the air that exits the rack through the first side air flow pathway and the plurality of return pipe couplings include one or more fin tube sections for cooling the air that exits the rack through the second side air flow pathway.

In another embodiment of the method, the step of automatically moving the fin tube assembly may include actuating a hydraulic cylinder secured between a door frame and the fin tube assembly.

Yet another embodiment of the method may include sealing a plate between the fin tube assembly and a door frame when the fin tube assembly is in the retracted position.

Embodiments of the method include detecting an operating condition within the rack. In one option, this may include an air pressure sensor detecting an air pressure within the rack. Accordingly, the method may include providing air pressure signals from the air pressure sensors to a management entity, and sending a control signal from the management entity to the actuator. In another option, detecting an operating condition within the rack may include detecting a temperature of one or more computer system components within the rack. Therefore, temperature signals may be provided from a temperature sensor to a management entity, and the management entity may provide a control signal to the actuator.

Figure 1:
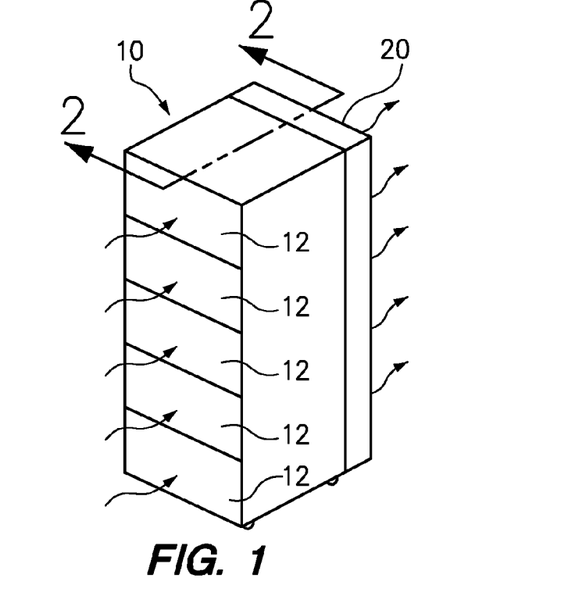
FIG. 1 is a perspective view of a computer system rack having a rear door heat exchanger.

FIG. 1 is a perspective view of a computer system rack 10 having a rear door heat exchanger 20. Components 12 such as servers and switches are organized and operated within the rack 10. Operation of the components 12 generates heat that must be removed to avoid damage to the components. Fans within the components or subchassis in the rack 10 draw air (illustrated as wavy arrows) in the front of the components and the air is heated as it passes through the rack cooling the components. The host air then exits the rack through the rear door heat exchanger 20, which cools the air.

Figure 2:
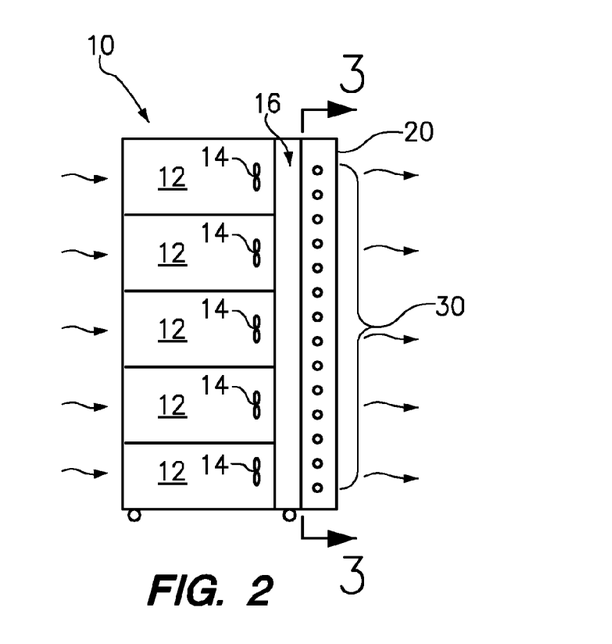
FIG. 2 is a schematic side view of the computer system rack and rear door heat exchanger.

FIG. 2 is a schematic side view of the computer system rack 10 having the rear door heat exchanger 20. A fan 14 is shown in each of the components 12 for generating the air flow through the rack from front to back (left to right as shown in FIG. 2). The rack 10 includes an open air space or gap 16 downstream of the components 12 and just upstream of the rear door heat exchanger 20. The rear door heat exchanger 20 has a fin tube assembly 30 that provides air-to-liquid cooling.

The rack 10 typically contains a plurality of computing devices 12, which may be, for example, servers, switches, power supplies, storage devices, and management modules. These computing devices typically have one or more on-board fan 14 to draw cool air into a housing and across heat-generating components within the housing before the warmed exhaust air is released to the rear of the housing. The fans cause an increase in air pressure near the outlet of the fans along the rear gap 16 of the rack. The high pressure air in the rear of the rack will escape through one or more paths of least resistance. Most of the air passes through the rear door heat exchanger 20.

However, the present invention recognizes that the fin tube structure of the rear door heat exchanger has some impedance to air flow. As the rate of air flow from the computing devices increases, the air pressure in the rear of the rack (i.e., the "rack side" of the rear door heat exchanger) will rise. This higher air pressure can have the negative effect of causing a loss of cooling air flow and perhaps also backflow of warmed exhaust air affecting one or more of the computing devices. These negative effects are most likely to have an impact on computing devices having weaker fans or lower air flow output, such as may be measured in cubic feet per minute (CFM). Within the rack, computing devices that have high-CFM fans can force warmed exhaust air to backflow into other computing devices that have low-CFM fans. As a result, computing devices with the lowest airflow among the computing devices of a given rack may be at risk of overheating when the total airflow through the rack exceeds the air flow capacity of the rear door heat exchanger.

Figure 3:
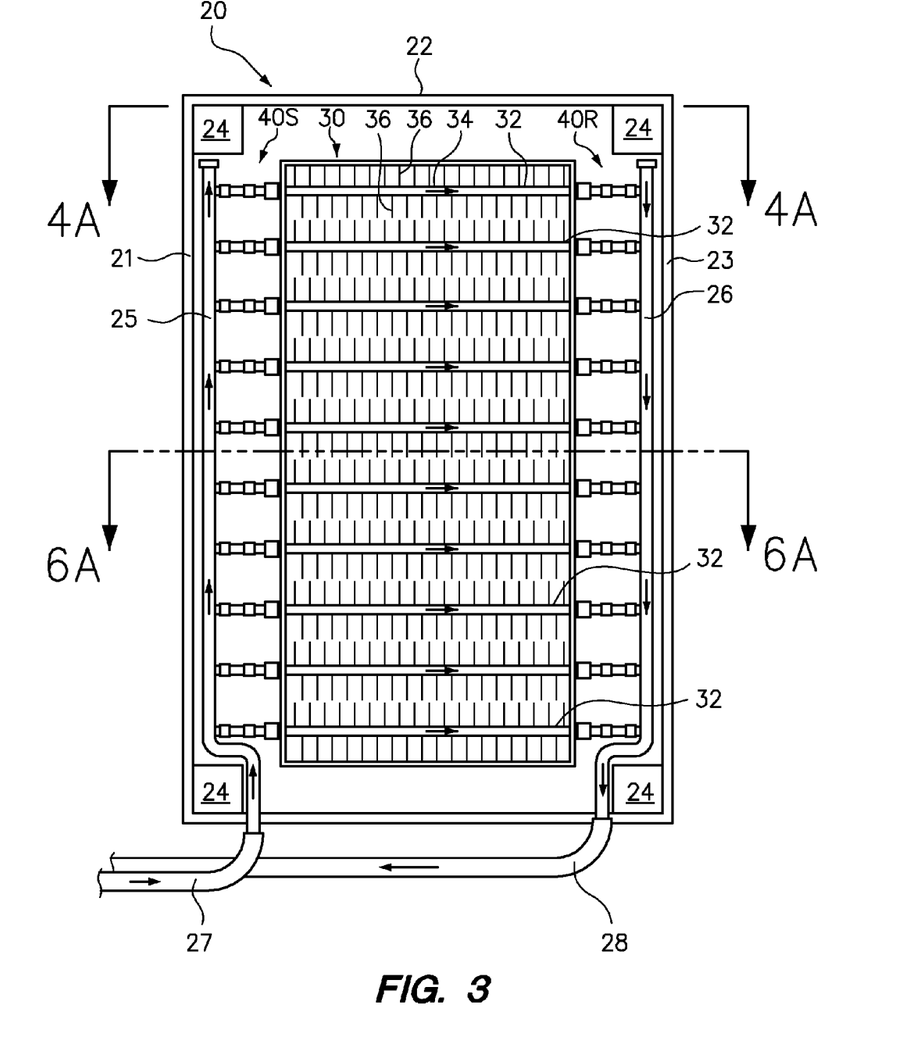
FIG. 3 is an elevation view of the of rear door heat exchanger.

FIG. 3 is an elevation view of the of rear door heat exchanger 20. The rear door heat exchanger 20 includes a door frame 22 having a first edge 21 and an opposing second edge 23. A set of four actuators 24 are secured to the door frame 22 and are used to controllably move the fin tube assembly 30 from a retracted position to an extended position, as described in greater detail below in reference to FIGS. 4A-B.

A fluid supply manifold 25 is secured along the first edge 21 of the door frame 22 and is coupled to a fluid supply hose 27, preferably along the lower edge of the door 20. Conversely, a fluid return manifold 26 is secured along the second edge 23 of the door frame 20 and is coupled to a fluid return hose 28, preferably also along the lower edge of the door 20.

The fin tube assembly 30 is located in a central region of the door 20 and forms a central air pathway for air to exit a rack. The fin tube assembly 30 includes a plurality of fin tubes 32 extending across the central region. Each fin tube 32 has a thermally conductive fluid conduit 34 and a large number of thermally conductive fins 36 extending in all directions surrounding the fluid conduit 34. The fin tubes 32 are preferably arranged in a pattern such that the fins 36 of one fin tube 32 are immediate adjacent or touching the fins 36 of an adjacent fin tube 32. As shown, the fin tubes 32 may be arranged horizontally and in parallel with each other. Air is able to pass between the fins 36, such that the air comes in contact with the fins 36 and transfers heat to the fins 36 and the outer surface of the fluid conduit 34. As heat is transferred to the fin tubes 32, the heat is then carried away in a cooling fluid that circulates through the fin tubes 32.

A plurality of supply pipe coupling assemblies 40-S provide fluid communication from the fluid supply manifold 25 to the plurality of fin tubes 32 and a plurality of return pipe coupling assemblies 40-R provide fluid communication from the plurality of fin tubes 32 to the fluid return manifold 26. The supply and return pipe coupling assemblies 40-S, 40-R are preferably mirror images of each other, and they may be described in greater detail in reference to FIGS. 6A-D, where they are referred to collectively as pipe coupling assemblies 40. As shown in FIG. 3, the cooling fluid follows a pathway from the fluid supply hose 27, through the fluid supply manifold 25, through a plurality of parallel fluid pathways including a supply pipe coupling assembly 40-S, a fin tube 32 and a return pipe coupling assembly 40-R, to the fluid return manifold 26, and out the fluid return hose 28.

Figure 4A:
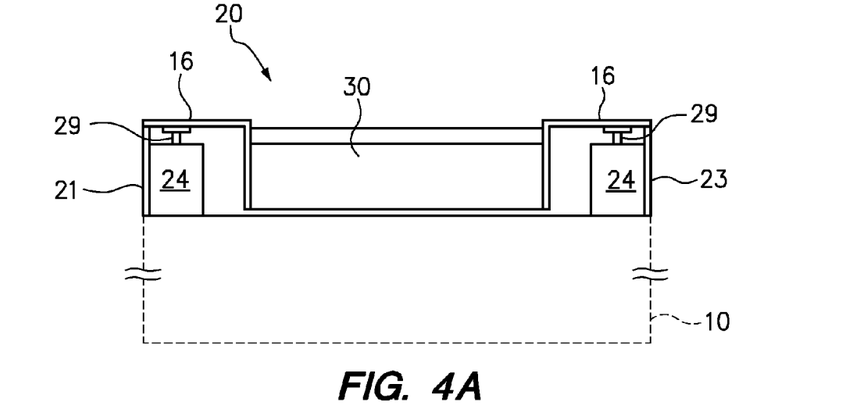
FIGS. 4A-B are schematic plan views of the rear door heat exchanger in a retracted position and an extended position, respectively.
Figure 4B:
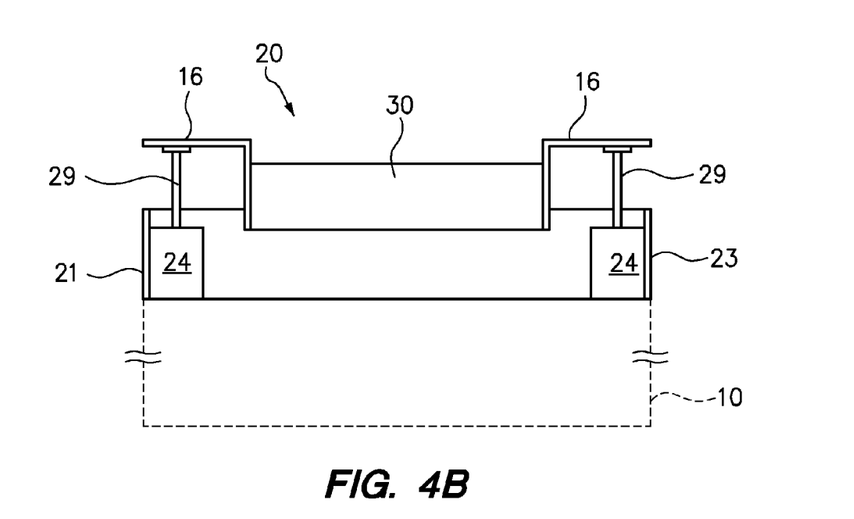

FIGS. 4A-B are schematic plan views of the rear door heat exchanger 20 in a retracted position and an extended position, respectively. A first actuator 24 is secured to the first edge 21 of the door frame 22 (See FIG. 3) and a second actuator 24 is secured to the opposing second edge 23 of the door frame. Each of the actuators 24 includes a rod 29 that is secured to a sealing plate 16 that is secured to the fin tube assembly 30. In FIG. 4A, the fin tube assembly 30 is in the retracted position and the sealing plates 16 make contact with the first and second edges 21, 23 of the door frame to prevent air passage there between. Therefore, air exiting the rack 10 may only flow through the fin tube assembly 30. In FIG. 4B, the actuator 24 has its rod 29 extended such that the fin tube assembly 30 is in the extended position. In the extended position, air from the rack 10 may still flow through the fin tube assembly 30, but air may now also flow through the gaps between the sealing plates 16 and the first and second edges 21, 23 of the door frame. These gaps may be referred to as side air pathways. Details of the fin tube assembly 30 and the pipe coupling assemblies 40 have been omitted from FIGS. 4A-B for clarity.

Figure 5A:
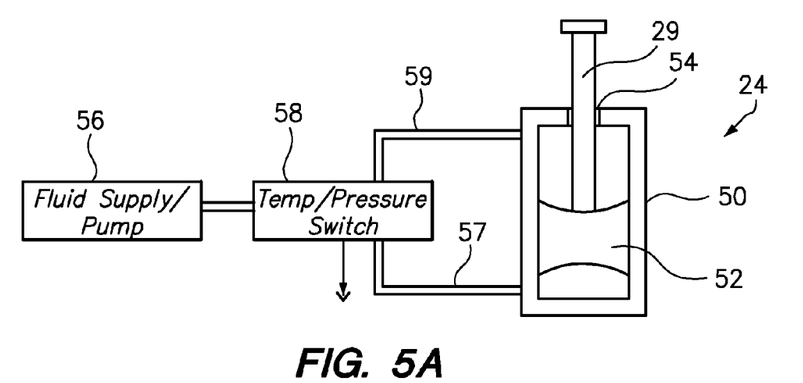
FIGS. 5A-B are schematic diagrams of an actuator based on a hydraulic piston.

FIGS. 5A-B are schematic diagrams of an actuator 24 based on a hydraulic cylinder 50. Referring to FIG. 5A, the hydraulic cylinder 50 includes a piston 52 coupled to the rod 29 that extends through a sleeve 54 in the end of the cylinder 50. A fluid supply or pump 56 provides a pressurized fluid to the temperature or pressure switch 58. The switch 58 selectively directs the pressurized fluid through a first conduit 57 to a first side of the piston 52 so that the piston pushes the rod 29 to an extended position (as in FIG. 4B), or directs the pressurized fluid through a second conduit 59 to a second side of the piston 52 so that the piston pushes the rod 29 to a retracted position (as in FIG. 4A). Fluid on the opposite side of the piston 52 from the pressurized fluid is withdrawn through the relevant conduit, optionally to a drain or recirculation vessel.

Figure 5B:
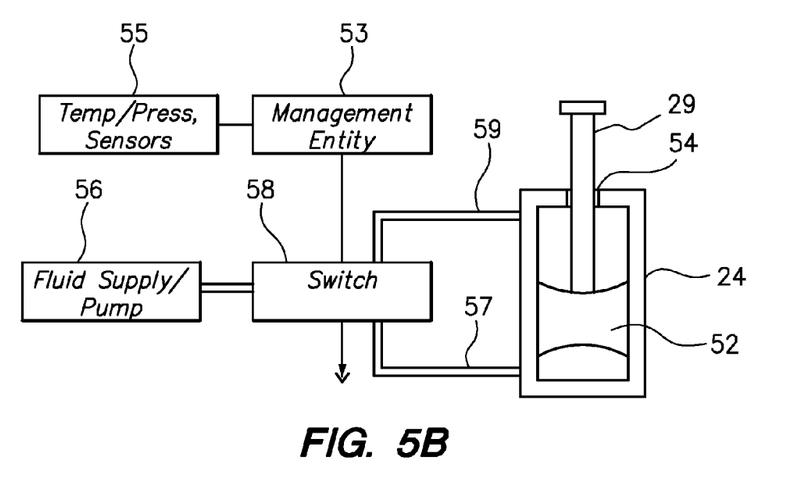

Referring to FIG. 5B, the fluid supply or pump 56, switch 58, and hydraulic cylinder 50 operate substantially as described in relation to FIG. 5A. However, the switch 58 is controlled by a signal from a management entity 53, which considers input signals from various temperature or pressure sensors 55. These sensors may be placed throughout the rack and rear door heat exchanger, either as part of a computer component of the rack or as part of a dedicated control system for the rear door heat exchanger. For example, pressure sensors may be spaced across the rack-side face of the fin tube assembly 30 (See FIG. 3).

FIGS. 6A-D are schematic diagrams of the rear door heat exchanger 20 at retracted (FIG. 6A), intermediate (FIGS. 6B-C), and extended (FIG. 6D) positions emphasizing the pivot coupling assemblies 40 that couple the fin tubes 32 to the supply manifold 25 and return manifold 26.

Figure 6A:
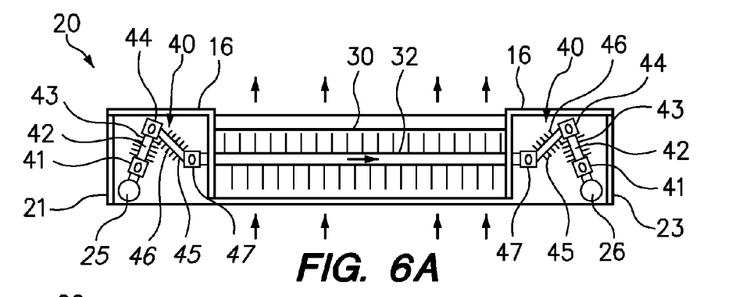
FIGS. 6A-D are schematic diagrams of the rear door heat exchanger at retracted, intermediate and extended positions emphasizing the pivot coupling assemblies that couple the fin tubes to the supply and return manifolds.

In FIG. 6A, the fin tube assembly 30 is in the retracted position (See also FIG. 4A). Fluid from the fluid supply manifold 25 is provided to the fin tube 32 through pivot coupling assembly 40 and fluid from the fin tube 32 is provided to the fluid return manifold 26 through another pivot coupling assembly 40. Each pivot coupling assembly 40 includes a first pivot coupling 41 secured to the manifold, a first fin tube 42 including fins 43, a second pivot coupling 44, a second fin tube 45 including fins 46, and a third pivot coupling 47 secured to the fin tube 32 of the fin tube assembly 30. The first, second and third pivot couplings 41, 44, 47 allows the pivot coupling assemblies to bend as the fin tube assembly 30 is moved from the retracted position to the extended position through intermediate positions.

Figure 6B:
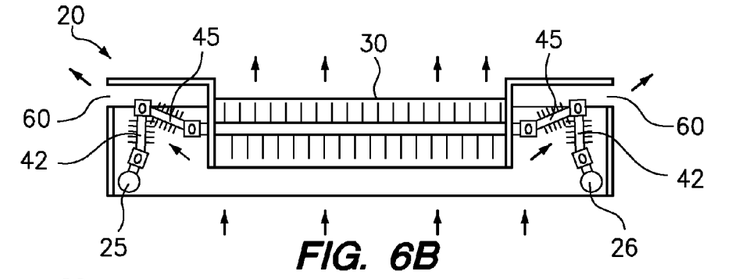

In FIG. 6B, the fin tube assembly 30 is in a first intermediate position such that a small amount of air can exit the rack through side gaps or air pathways 60. As shown, air passing through the side pathways 60 passes through one of the pivot coupling assemblies 40, such that the air is cooled by the first and second fin tubes 42, 45. Note that the first, second and third pivot couplings 41, 44, 47 allow a change in the angle between adjacent fin tube and conduit sections.

Figure 6C:
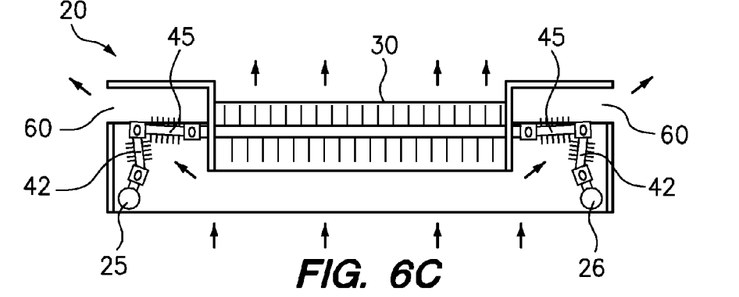

In FIG. 6C, the fin tube assembly 30 is in a second intermediate position such that a somewhat greater amount of air (compared to FIG. 6B) can exit the rack through side gaps or air pathways 60. Air passing through the side pathways 60 still passes through one of the pivot coupling assemblies 40, such that the air is cooled by the first and second fin tubes 42, 45. Note that the first, second and third pivot couplings 41, 44, 47 have allowed a further change in the angle between adjacent fin tube and conduit sections.

Figure 6D:
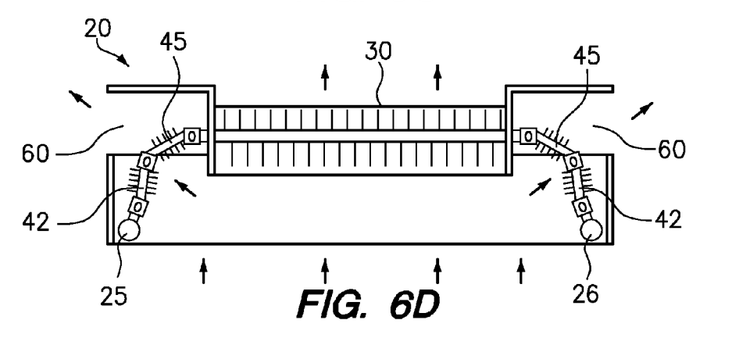

In FIG. 6D, the fin tube assembly 30 is in the extended position such that a large amount of air (compared to FIG. 6C) can exit the rack through side gaps or air pathways 60. Air passing through the side pathways 60 still passes through one of the pivot coupling assemblies 40, such that the air is cooled by the first and second fin tubes 42, 45. Note that the first, second and third pivot couplings 41, 44, 47 have allowed a further change in the angle between adjacent fin tube and conduit sections. In the embodiment shown, FIG. 6D illustrates the extended position of the fin tube assembly 30, where the rear door heat exchanger 20 provides its maximum amount of cooling capacity (i.e., greatest amount of cooling surface area.

It should be emphasized that the movement shown in FIGS. 6A-D represent the movement of the fin tube assembly 30 from the retracted position to the extended position. Movement from the extended position to the retracted position is the exact opposite. Both movements occur as the result of the forces imparted by the actuator 24 as described earlier in reference to FIGS. 4A-B. The pivot coupling assemblies 40 support continuous fluid flow at any and all positions of the fin tube assembly 30, and the fluid flow rate may be independently controlled.

Figure 7A:
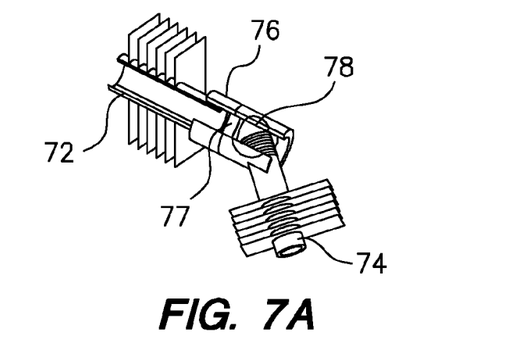
FIGS. 7A-C are diagrams of three types of pivot couplings that may be used in accordance with embodiments of the present invention.
Figure 7B:
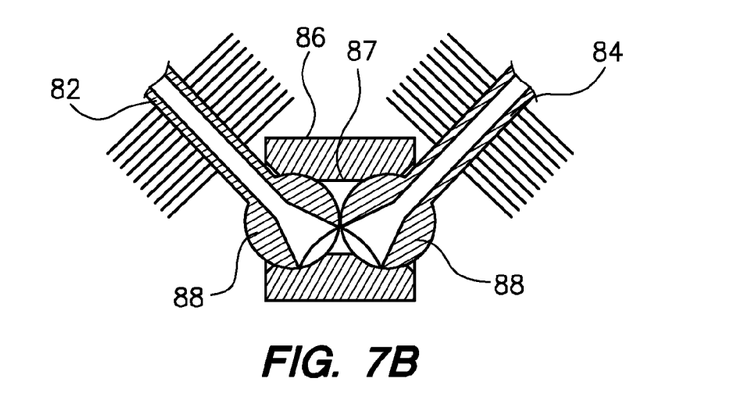
Figure 7C:
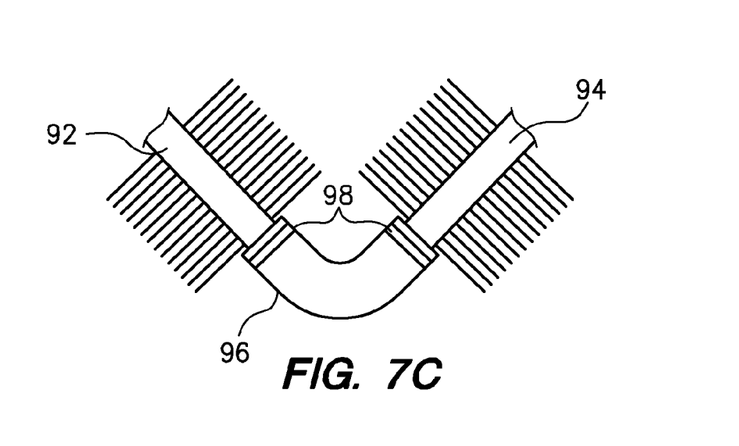

FIGS. 7A-C are diagrams of three types of pivot couplings that may be used in accordance with embodiments of the present invention. FIG. 7A is a partial cross-sectional perspective view of two adjacent fin tube sections 72, 74 coupled by a pivot coupling 76. The pivot coupling 76 includes a central channel 77 with a seat for securing a ball 78. The ball 78 includes its own central channel that is in fluid communication with the fin tube section 74 and is able to pivot within the seat.

FIG. 7B is a cross-sectional diagram of two adjacent fin tube sections 82, 84 coupled by a pivot coupling 86. Here, the body of the coupling 86 includes two seats for securing two balls 88 that pivot within the seats. A channel 87 between the two seats allows the two adjacent fin tube sections 82, 84 to achieve various angles while maintaining fluid communication.

FIG. 7C is a diagram of two adjacent fin tube sections 92, 94 coupled by a pivot coupling that is made from a flexible hose 96. The flexible hose 96 may be secured to the fin tube sections 92, 94 with hose clamps 98.

As will be appreciated by one skilled in the art, the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in one or more computer-readable storage medium having computer-usable program code stored thereon.

Any combination of one or more computer usable or computer readable storage medium(s) may be utilized. The computer-usable or computer-readable storage medium may be, for example but not limited to, an electronic, magnetic, electromagnetic, or semiconductor apparatus or device. More specific examples (a non-exhaustive list) of the computer-readable medium include: a portable computer diskette, a hard disk, random access memory (RAM), read-only memory (ROM), an erasable programmable read-only memory (EPROM or Flash memory), a portable compact disc read-only memory (CD-ROM), an optical storage device, or a magnetic storage device. The computer-usable or computer-readable storage medium could even be paper or another suitable medium upon which the program is printed, as the program can be electronically captured via, for instance, optical scanning of the paper or other medium, then compiled, interpreted, or otherwise processed in a suitable manner, if necessary, and then stored in a computer memory. In the context of this document, a computer-usable or computer-readable storage medium may be any storage medium that can contain or store the program for use by a computer. Computer usable program code contained on the computer-usable storage medium may be communicated by a propagated data signal, either in baseband or as part of a carrier wave. The computer usable program code may be transmitted from one storage medium to another storage medium using any appropriate transmission medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable storage medium that can direct a computer or other programmable data processing apparatus to function in a particular manner, such that the instructions stored in the computer-readable storage medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
   flowing a liquid through a plurality of pivotal supply pipe coupling assemblies to a fin tube assembly of an air-to-liquid heat exchanger and through the fin tube assembly to a plurality of pivotal return pipe coupling assemblies, wherein the fin tube assembly forms a central air flow pathway;
   passing air through components within a rack secured to the rear door heat exchanger and through the fin tube assembly;
   detecting an operating condition within the rack; and
   automatically moving the fin tube assembly from a retracted position to an extended position in response to the operating condition exceeding an operating condition threshold,
      wherein the retracted position of the fin tube assembly directs substantially all of the air to exit the rack through the central air flow pathway, wherein the extended position of the fin tube assembly allows the air to exit the rack through the central air flow pathway and also through first and second side air flow pathways, wherein moving the fin tube assembly from the retracted position to the extended position causes the plurality of pivotal supply pipe coupling assemblies to extend across the first side air flow pathway and the plurality of pivotal return pipe coupling assemblies to extend across the second side air flow pathway, and wherein the plurality of pivotal supply pipe coupling assemblies include one or more fin tube sections for cooling the air that exits the rack through the first side air flow pathway and the plurality of pivotal return pipe coupling assemblies include one or more fin tube sections for cooling the air that exits the rack through the second side air flow pathway.

2. The method of claim 1, wherein automatically moving the fin tube assembly includes actuating a hydraulic cylinder secured between a door frame and the fin tube assembly.

3. The method of claim 1, further comprising:
   sealing a plate between the fin tube assembly and a door frame when the fin tube assembly is in the retracted position.

4. The method of claim 1, wherein detecting an operating condition within the rack includes an air pressure sensor detecting an air pressure within the rack.

5. The method of claim 4, further comprising:
   providing air pressure signals from the air pressure sensors to a management entity; and
   sending a control signal from the management entity to the actuator.

6. The method of claim 1, wherein detecting an operating condition within the rack includes detecting the temperature of one or more computer system components within the rack.

* * * * *